(12) United States Patent
Leyten et al.

(10) Patent No.: US 6,342,820 B1
(45) Date of Patent: Jan. 29, 2002

(54) BALANCED OSCILLATOR HAVING A SHORT CIRCUITED QUARTER-WAVE PAIRED LINE

(75) Inventors: Lukas Leyten; Antonius G. Wagemans, both of Eindhoven (NL)

(73) Assignee: U.S. Philips Corporation, New York, NY (US)

(*) Notice: Subject to any disclaimer, the term of this patent is extended or adjusted under 35 U.S.C. 154(b) by 0 days.

(21) Appl. No.: 09/593,917

(22) Filed: Jun. 14, 2000

(30) Foreign Application Priority Data

Jun. 16, 1999 (EP) ............................................. 99201925

(51) Int. Cl.[7] ................................................. H03B 5/18
(52) U.S. Cl. ................................ 331/117 D; 331/117 R; 331/96; 331/177 R; 331/177 V
(58) Field of Search ....................... 331/117 R, 117 FE, 331/117 D, 96, 99, 100, 101, 102, 114, 108 D, 117 V, 177 R

(56) References Cited

U.S. PATENT DOCUMENTS

| | | | | |
|---|---|---|---|---|
| 2,414,991 A | * | 1/1947 | Wheeler | 331/100 |
| 2,573,517 A | * | 10/1951 | Van Weel | 331/99 |
| 2,763,734 A | * | 9/1956 | Mulder | 331/100 |
| 5,138,284 A | * | 8/1992 | Yabuki et al. | 331/56 |
| 5,250,910 A | * | 10/1993 | Yabuki et al. | 331/56 |
| 5,523,720 A | * | 6/1996 | Omoto | 329/325 |
| 5,831,487 A | | 11/1998 | Heilmann et al. | 331/117 |

FOREIGN PATENT DOCUMENTS

EP 0133799 A2 3/1985 ............. H03J/3/18

OTHER PUBLICATIONS

By Thomas H. Lee: Entitled "The Design of CMOS Radio Radio–Frequency Integrated Circuits" Cambridge University Press, Cambridge, UK pp. 512–514, 1998.

* cited by examiner

Primary Examiner—David Mis
(74) Attorney, Agent, or Firm—Jack D. Slobod

(57) ABSTRACT

A balanced oscillator comprises a frequency selective circuit and a balanced active circuit coupled with the frequency selective circuit. The frequency selective circuit includes a short circuited quarter-wave paired line. A cost effective short circuited quarter-wave paired line can be U-shaped to take up only a small space and can be integrated easily on a dielectric, especially glass. The balanced active circuit comprises a cross coupled differential pair of transistors. The balanced oscillator can be tuned in a number of different ways.

13 Claims, 1 Drawing Sheet

BALANCED OSCILLATOR HAVING A SHORT CIRCUITED QUARTER-WAVE PAIRED LINE

BACKGROUND OF THE INVENTION

1. Field of the Invention

The present invention generally relates to a voltage controlled oscillator and a RF device. The present invention specifically relates to a balanced oscillator consisting of a frequency elective circuit and a balanced active circuit coupled with the frequency selective circuit.

2. Description of the Related Art

A prior art balanced oscillator disclosed in EP-A-0 133 799 has a balanced frequency selective circuit in the form of a tuning circuit and a balanced active circuit in the form of a feedback amplifier pair coupled with the tuning circuit. The balanced tuning circuit has a main electrode having a neutral ground terminal and providing a distributed inductance, the main electrode having balanced terminals. An auxiliary electrode is disposed in confronting relation to the main electrode with a dielectric interposed therebetween, and has opposite ends serving as ground terminals.

It is a disadvantage of the known balanced oscillator that it has a complex construction with a multiplicity of grounding terminals and electrodes. Such a construction is difficult to integrate on a limited chip area.

SUMMARY OF THE INVENTION

Accordingly it is an object of the present invention to provide a balanced oscillator, which can be easily and cost effectively integrated on a limited chip area and which has a minimum number of components.

Thereto the balanced oscillator is according to the present invention characterized in that the frequency selective circuit comprises a short circuited quarter-wave paired line.

It is an advantage of the oscillator according to the present invention that such a short circuited quarter-wave paired line also is a balanced circuit, which leads to a fully balanced oscillator. Such a fully balanced oscillator is easy to integrate in a reproducible and accurate manner. In addition its geometry is such that it only has to have one supply voltage (or ground terminal) such that its construction is simplified. Furthermore the short circuited quarter-wave line AC-isolates the supply of the oscillator from the active circuit, thus improving the frequency stability and reliable operation of the oscillator according to the invention.

In one embodiment of the balanced oscillator according to the present invention the short circuited quarter-wave paired line is essentially U-shaped, which reduces the necessary chip area even further.

A further embodiment of the oscillator according to the present invention is characterized in that the short circuited quarter-wave paired line is coplanar. Advantageously this results in the absence of a voluminous ground plate in the frequency selective circuit of the present oscillator. In addition the coplanar nature of the paired line results in a diminished electromagnetic coupling to neighboring circuits.

A still further embodiment of the oscillator according to the present invention is characterized in that the coplanar short circuited quarter-wave paired line is integrated on a dielectric isolator or isolator, such as glass, alumina, silicon dioxide or any other insulator material used in the semiconductor industry. In particular glass shows low losses, and a well achievable coplanarity thereof does not result in a significant electromagnetic coupling to any circuit present at the other side of the isolator or dielectric isolator.

Another embodiment of the oscillator according to the present invention is characterized in that the balanced active circuit comprises a differential amplifier, which shows accurate reproducible properties and furthermore consumes low power for supplying a negative resistance while functioning as an active circuit in the oscillator. In particular, a crosscoupled feedback amplifier is preferred because of its additional reduced number of components thereof.

Easy tuning with a still further reduced number of components is achieved in still another embodiment of the balanced oscillator according to the present invention, which is characterized in that the tuning circuit in particular comprises at least one of the following means: (i) varactor (variable capacitor) means, (ii) oscillator supply voltage varying means, (iii) differential amplifier tail current varying means, and (iv) means for trimming the length of the short circuited quarter-wave paired line.

BRIEF DESCRIPTION OF THE DRAWINGS

At present, the balanced oscillator according to the present invention will be elucidated further together with its additional advantages while reference is being made to the appended drawing, wherein similar components are being referred to by means of the same reference numerals. In the drawing.

DETAILED DESCRIPTION OF THE INVENTION

Figure 1:
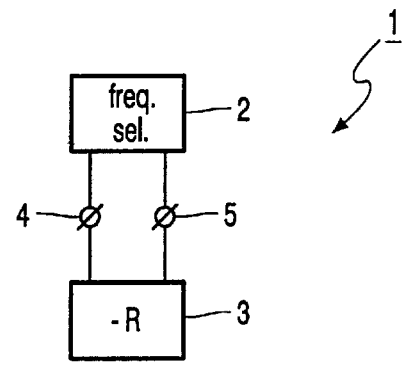
FIG. 1 shows a principle scheme of a prior art balanced oscillator.

FIG. 1 shows a balanced oscillator 1 comprising a frequency selective circuit 2 and a balanced active circuit 3 coupled with the frequency selective circuit 2 through terminals 4 and 5. The frequency selective circuit 2 is generally embodied as a resonant circuit as known in the art. The active circuit 3 provides a negative resistance indicated –R for initiating oscillations in the oscillator 1.

Figure 2:
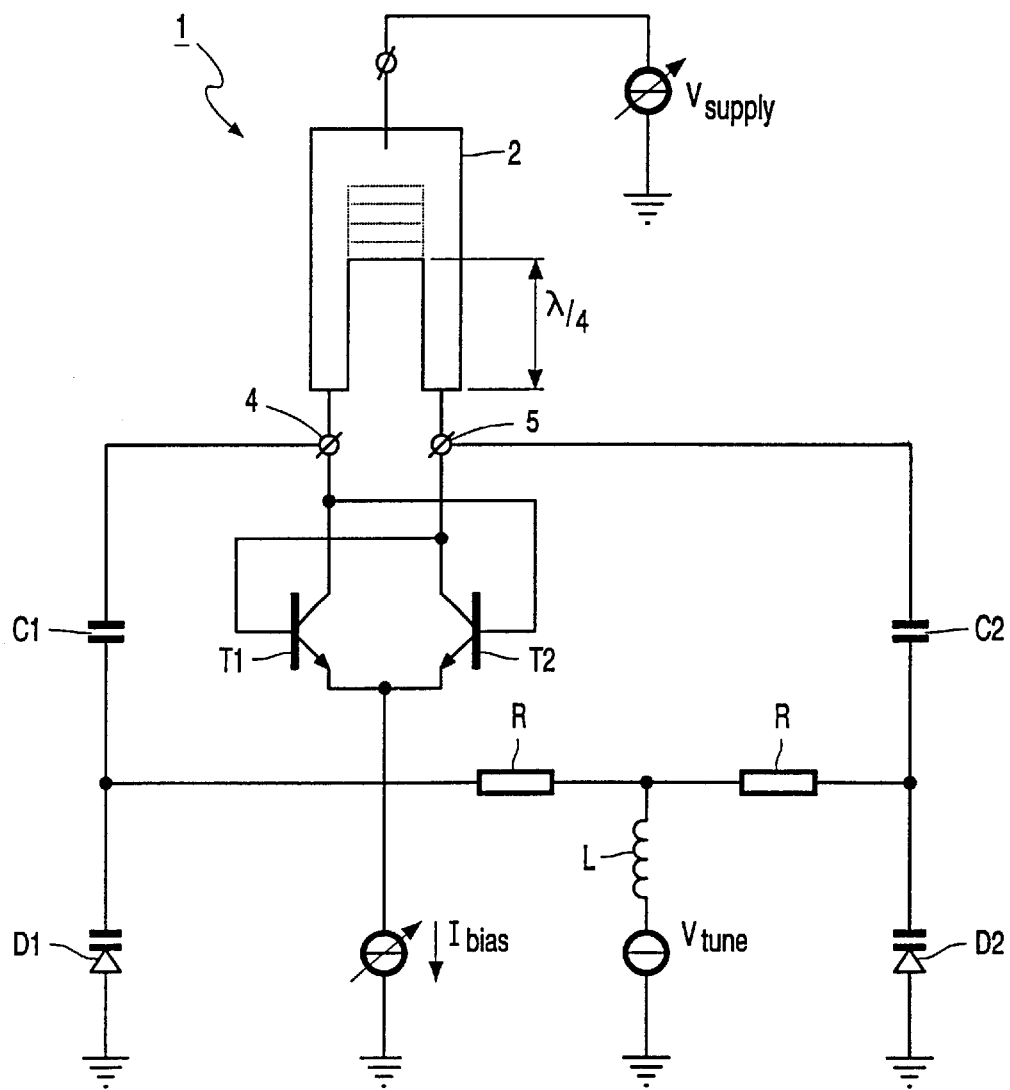
FIG. 2 shows one embodiment of a balanced oscillator according to the present invention.

FIG. 2 shows one embodiment of the balanced oscillator 1, wherein the frequency selective circuit 2 is embodied as a short circuited quarter-wave paired line, which can easily be integrated. The paired line 2 as shown is U-shaped having two legs with an equal length of $\lambda/4$ (at the shortest, or possibly an odd multiple thereof), where $\lambda$ is the wavelength of the oscillating frequency of the oscillator 1. An upper supply terminal of the circuit 2 is connected to a supply voltage source $V_{supply}$, which source may be an adjustable voltage source in order to tune the frequency of the oscillator 1. The length of the paired line 2 results in a good isolation between the supply source and the remaining part of the oscillator 1. Such a paired line 2 is balanced and generally coplanar and does not necessitate a grounded plate at the other side of the isolator or dielectric isolator, whereon it is provided. The terminals 4 and 5 are connected to the respective lower ends of the short circuited quarter wave paired line 2. Each of the terminals 4 and 5 is connected to the main stream (read: collector-emitter) path of the respective controllable semiconductors T1 and T2. The control ports (read: bases) of the semiconductors T1 and T2 are cross-wise connected to the collector of the other transistor. The tail current of the thus formed differential pair T1, T2 is provided by a current source $I_{bias}$, which may be an adjustable current source in order to tune the frequency of the fully balanced oscillator 1. This is a second possible way of tuning the frequency of the oscillator 1.

A third way of tuning the oscillator 1 is shown in the FIG. 2 and comprises two capacitors C1 and C2, which are connected to the terminals 4 and 5 and are connected in series with respective varactor diodes D1 and D2. Between the joined connecting point of C1, D1 and C2, D2 at the one hand and earth at the other hand there is provided a voltage source $V_{tune}$ for providing a balanced frequency tuning. Generally resistors R or a coil L are connected to the voltage source in order to provide RF decoupling thereof.

The dielectric isolator or isolator, whereon the short circuited quarter-wave paired line 2 is provided could be glass, alumina, silicon dioxide or any other similar kind of appropriate isolator material used in the semiconductor industry. It is shown schematically in FIG. 2 that the body part of the paired line 2 where both legs or lines come together can be composed of a kind of ladder construction (shown by dotted lines) such that by means of etching or lasering of one or more of the ladder parts the resonance frequency can be shifted. Alternatively scribing is possible so that in a continuous process trimming can take place. This is a fourth way of tuning or trimming the oscillator 1.

The balanced oscillator finds application in a voltage controlled oscillator and/or in an RF device, such as a transmitter, receiver, transceiver, radio, television, tuner, communication device, telephone, or the like.

What is claimed is:

1. A balanced oscillator, comprising:
   a frequency selective circuit including a short circuited quarter-wave paired line; and
   a balanced active circuit coupled to said short circuited quarter-wave paired line.

2. The balanced oscillator of claim 1, wherein said short circuited quarter-wave paired line is essentially U-shaped.

3. The balanced oscillator of claim 1, wherein said short circuited quarter-wave paired line is coplanar.

4. The balanced oscillator of claim 3, wherein said short circuited quarter-wave paired line is integrated on an isolator.

5. The balanced oscillator of claim 1, wherein said balanced active circuit includes a differential amplifier.

6. The balanced oscillator of claim 5, wherein said differential amplifier is a cross-coupled feedback amplifier.

7. The balanced oscillator of claim 1 further comprising:
   a tuning circuit coupled to said balanced active circuit, said tuning circuit operable to tune a frequency of the balanced oscillator.

8. The balanced oscillator of claim 7, wherein said tuning circuit includes an adjustable current source coupled to said balanced active circuit.

9. The balanced oscillator of claim 7, wherein said tuning circuit includes
   a voltage source coupled to said balanced active circuit;
   a first varactor diode coupled to said balanced active circuit; and
   a second varactor diode coupled to said balanced active circuit.

10. The balanced oscillator of claim 1, wherein said short-circuited quarter-wave paired line is capable of being trimmed to tune a frequency of the balanced oscillator.

11. The balanced oscillator of claim 1, wherein said frequency selective circuit includes an adjustable voltage supply source coupled to said short circuited quarter-wave paired line, said adjustable voltage supply source operable to tune a frequency of the balanced oscillator.

12. A balanced oscillator, comprising:
   a frequency selective circuit including a short circuited quarter-wave paired line;
   a balanced active circuit including a differential amplifier coupled to said short circuited quarter-wave paired line, said differential amplifier having a pair of emitter terminals; and
   a tuning circuit including an adjustable current source coupled to said pair of emitter terminals, said adjustable current source operable to tune a frequency of the balanced circuit.

13. A balanced oscillator, comprising:
   a frequency selective circuit including a short circuited quarter-wave paired line having a first output terminal and a second output terminal;
   a balanced active circuit including a differential amplifier coupled to said first output terminal and second output terminal; and
   a tuning circuit including:
      a voltage source coupled to said first output terminal and said second output terminal,
      a first varactor diode coupled to said first output terminal and said second output terminal, and
      a second varactor diode coupled to said first output terminal and said second output terminal.

* * * * *